United States Patent [19]

Peters

[11] Patent Number: 4,961,528

[45] Date of Patent: Oct. 9, 1990

[54] METHOD OF PROVIDING A SEMICONDUCTOR BODY ON A SUPPORT

[75] Inventor: Petrus J. M. Peters, Eindhoven, Netherlands

[73] Assignee: U.S. Philips Corporation, New York, N.Y.

[21] Appl. No.: 326,583

[22] Filed: Mar. 21, 1989

[30] Foreign Application Priority Data

Apr. 8, 1988 [NL] Netherlands ........................ 8800902

[51] Int. Cl.$^5$ .................... B23K 103/10; H01L 21/48; H01L 21/58; H01L 21/603
[52] U.S. Cl. ................................... 228/123; 228/124; 228/208; 228/254; 228/261; 228/263.12; 228/263.17; 437/222
[58] Field of Search ............... 228/122, 123, 124, 208, 228/263.11, 188, 254, 256, 261, 263.12, 263.17; 437/187, 188, 209, 221, 222; 428/417, 607; 357/81

[56] References Cited

U.S. PATENT DOCUMENTS

| 3,872,577 | 3/1975 | Kugler et al. | 228/208 |
| 3,896,542 | 7/1975 | Dale | 437/222 |
| 4,286,743 | 9/1981 | Vasseur et al. | 228/188 |
| 4,448,853 | 5/1984 | Fischer et al. | 228/263.11 |
| 4,542,401 | 9/1985 | Sekiba | 228/123 |
| 4,729,504 | 3/1988 | Edamura | 228/122 |
| 4,757,934 | 7/1988 | Greenstein | 228/123 |
| 4,817,853 | 4/1989 | Scanlon | 228/124 |
| 4,905,886 | 3/1990 | Kennedy et al. | 228/194 |

FOREIGN PATENT DOCUMENTS

| 94569 | 5/1984 | Japan | 228/194 |
| 703871 | 12/1979 | U.S.S.R. | 228/123 |
| 854627 | 8/1981 | U.S.S.R. | 228/263.17 |
| 2067117 | 7/1981 | United Kingdom . | |

Primary Examiner—Sam Heinrich
Attorney, Agent, or Firm—Norman N. Spain

[57] ABSTRACT

The invention relates to a method of providing a semiconductor body on a support with the interposition of a metal layer of aluminum. The adherence is effected in that the semiconductor body and the support are pressed against each other during the supply of heat at the area of the metal layer. The metal layer of aluminum is first applied to the support by flame spraying.

1 Claim, 1 Drawing Sheet

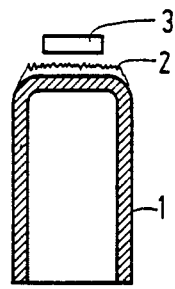

METHOD OF PROVIDING A SEMICONDUCTOR BODY ON A SUPPORT

BACKGROUND OF THE INVENTION

The invention relates to a method of providing a semiconductor body on a support with the interposition of a metal layer of aluminum, in which the adherence between the semiconductor body and the support is effected by pressing the body and support against each other while supplying heat to the area of the metal layer.

In such a method, an aluminum layer is provided on the support, mostly by a galvanic process or the like. A continuous smooth aluminum layer is then obtained. In order to promote the adherence between the semiconductor body and the support by means of the aluminum layer, this layer is provided with notches or the like, so that a favorable influence is exerted on the deformability of the aluminum layer when establishing the thermo-compression bond between the semiconductor body and the support. If, for example, a semiconductor body must be provided on a support, as is in the case inter alia when providing pn emitters in electron tubes, an additional processing step is required for thus roughening the smooth aluminum layer.

SUMMARY OF THE INVENTION

The invention has for its object to provide a method of the kind mentioned above, in which the disadvantage indicated above can be avoided, more particularly for avoiding the step of roughening the smooth aluminum layer.

According to the invention, this can be achieved by applying the metal layer of aluminum to the support by flame spraying.

When the aluminum layer is applied by means of flame spraying, a layer having an irregular surface will automatically be formed, as a result of which it is no longer necessary to roughen this surface by etching or notching or the like before the semiconductor body is provided.

BRIEF DESCRIPTION OF THE DRAWINGS

The sole FIGURE in the drawing is a diagrammatical view of a support provided with an aluminum layer and semiconductor to be provided a support.

DETAILED DESCRIPTION OF THE INVENTION

The invention will now be described more fully with reference to the sole figure of the drawing.

The sole figure shows diagrammatically a support 1, for example a cathode support. A metal layer 2 consisting of aluminum is applied to this support 1 by means of flame spraying. When such an aluminum layer 2 is applied by flame spraying, the outer appearance of this layer at its exposed surface automatically becomes rough. The unevennesses are shown in the figure on an exaggerated scale for the sake of clarity.

In order to secure a semiconductor body 3 on the support 1, this semiconductor body 3 can now be pressed in known manner against the aluminum layer 2 while supplying heat to this aluminum layer so that a so-called thermo-compression bond is then established. Due to the rough surface of the aluminum layer 2, this layer is sufficiently deformed so that a good adherence between the semiconductor body and the support is obtained without it being necessary for the aluminum layer to be subjected to an additional processing step beforehand after it has been applied to the support.

I claim:

1. A method of bonding a semiconductor body to a support comprising applying a layer of aluminum by flame spraying to a surface of the support and pressing the semiconductor body against the surface of the support provided with the aluminum layer while applying heat to said surface thereby forming a thermo-compression bond between the semiconductor body and the support.

* * * * *